US010319802B1

(12) United States Patent
Choi et al.

(10) Patent No.: US 10,319,802 B1
(45) Date of Patent: Jun. 11, 2019

(54) DISPLAY SUBSTRATE EDGE PATTERNING AND METALLIZATION

(71) Applicant: Microsoft Technology Licensing, LLC, Redmond, WA (US)

(72) Inventors: Minhyuk Choi, Mill Creek, WA (US); Rajesh Dighde, Redmond, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 15/821,584

(22) Filed: Nov. 22, 2017

(51) Int. Cl.

| | |
|---|---|
| ***H01L 27/32*** | (2006.01) |
| ***H01L 23/544*** | (2006.01) |
| ***G09G 3/3225*** | (2016.01) |
| *H01L 27/12* | (2006.01) |
| *H01L 51/56* | (2006.01) |
| *H01L 51/00* | (2006.01) |

(52) U.S. Cl.

CPC ....... *H01L 27/3276* (2013.01); *G09G 3/3225* (2013.01); *H01L 23/544* (2013.01); *G09G 2300/0408* (2013.01); *H01L 27/124* (2013.01); *H01L 27/1266* (2013.01); *H01L 51/003* (2013.01); *H01L 51/56* (2013.01); *H01L 2223/54493* (2013.01); *H01L 2227/323* (2013.01); *H01L 2227/326* (2013.01)

(58) Field of Classification Search

None

See application file for complete search history.

(56) References Cited

U.S. PATENT DOCUMENTS 5,434,745 A * 7/1995 Shokrgozar ......... H01L 25/0657 174/538
5,857,858 A * 1/1999 Gorowitz ............ H01L 25/0652 257/686
6,686,648 B2 * 2/2004 Gebauer ........... H01L 21/76898 257/621
6,727,116 B2 * 4/2004 Poo .................. H01L 23/49805 257/678
7,420,262 B2 * 9/2008 Bauer ..................... H01L 21/78 257/501
7,863,722 B2 * 1/2011 Chua ..................... H01L 21/561 257/685

(Continued)

OTHER PUBLICATIONS

"International Search Report and Written Opinion Issued in PCT Application No. PCT/US2018/060204", dated Jan. 30, 2019, 12 Pages.

*Primary Examiner* — Lex H Malsawma

(74) *Attorney, Agent, or Firm* — Ray Quinney & Nebeker P.C.; John O. Carpenter

(57) ABSTRACT

A display includes a display substrate having a patterned edge, the patterned edge including a plurality of notches. The display further includes a plurality of display signal lines supported by the display substrate on a first side of the display substrate, and a display control circuit disposed along a second side of the display substrate, the second side being opposite the first side. The display control circuit includes a plurality of contacts. Each display signal line of the plurality of display signal lines is disposed in a respective notch of the plurality of notches to traverse the patterned edge to establish an electrical connection between each display signal line of the plurality of display signal lines and a respective contact of the plurality of contacts.

20 Claims, 4 Drawing Sheets

(56) References Cited

U.S. PATENT DOCUMENTS

| | | | | |
|---|---|---|---|---|
| 8,030,179 | B2 * | 10/2011 | Hoshino | H01L 25/0657 257/E21.575 |
| 2004/0157410 | A1 * | 8/2004 | Yamaguchi | H01L 23/49805 438/460 |
| 2007/0134473 | A1 | 6/2007 | Kim | |
| 2012/0206682 | A1 * | 8/2012 | Onishi | G02F 1/136204 349/138 |
| 2013/0328051 | A1 * | 12/2013 | Franklin | G02F 1/136204 349/138 |
| 2014/0184057 | A1 | 7/2014 | Kim et al. | |
| 2016/0299370 | A1 | 10/2016 | Wu et al. | |
| 2018/0033763 | A1 * | 2/2018 | Chen | H01L 27/146 |

* cited by examiner

DISPLAY SUBSTRATE EDGE PATTERNING AND METALLIZATION

DESCRIPTION OF THE DRAWING FIGURES

For a more complete understanding of the disclosure, reference is made to the following detailed description and accompanying drawing figures, in which like reference numerals may be used to identify like elements in the figures.

Figure 1:
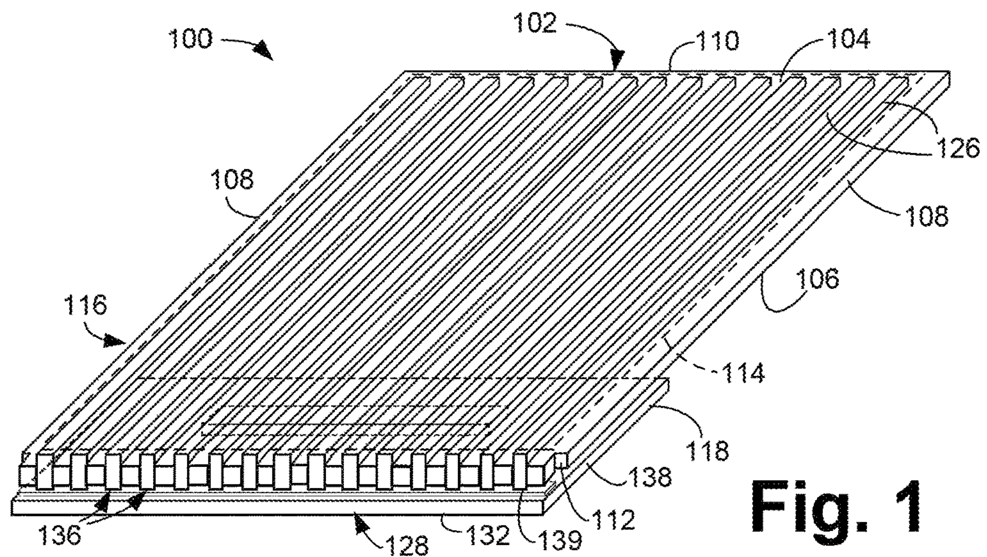
FIG. 1 is a partial, perspective view of a device with a patterned and metallized display substrate in accordance with one example.

The embodiments of the disclosed displays, devices, and methods may assume various forms. Specific embodiments are illustrated in the drawing and hereafter described with the understanding that the disclosure is intended to be illustrative. The disclosure is not intended to limit the invention to the specific embodiments described and illustrated herein.

DETAILED DESCRIPTION

Displays with one or more patterned and metallized substrate edges are described, along with devices including such displays. Methods of fabricating such displays and devices are also described. Space-efficient electrical connections of a display control circuit are established by the patterning and metallization of one or more of the substrate edges. Space along the border of the display that would otherwise be used for the electrical connection may instead be made a part of the active area of the display. A narrow display border may thus be achieved.

The display substrate is patterned to create a set of notches in an edge of the substrate. The edge may be a bottom or lower edge at which a control circuit is attached. The notches allow signal lines of the display, such as data line traces, to traverse, or continue over, the edge. The signal lines are disposed in the notches. Ends of the signal lines may then terminate at contacts of the control circuit. The notches thus help establish electrical connections between the signals lines and the control circuit.

With the edge patterning and metallization described herein, the electrical connections to the control circuit are disposed at the display edge rather than on the front side of the device. The edge patterning eliminates the space wasted in other display panel-control circuit arrangements. First, the control circuit is disposed on the back side of the display rather than on the front side. Second, space is not consumed by contacts on the front side, as would be the case in which a flexible circuit is used to wrap around the edge to reach a backside control circuit.

The patterning of the display substrate may be achieved via photolithography-based procedures. Metallization of the edge of the display substrate may be supported by a carrier substrate and a conductive adhesive layer disposed between the display substrate and the carrier substrate along the patterned edge. The carrier substrate is removed to expose the conductive adhesive layer under ends of the signal lines. Contacts of the control circuit may then be aligned with the signal line ends when the control circuit is attached to the display substrate. Back side bonding of the control circuit may thus be achieved without having to rely on a large border area.

The edge patterning and metallization achieves benefits other than a narrow display border. For instance, limitations on the signal lines that would otherwise arise from trace line fan-out are eliminated. Virtually the entire width of the display substrate may be used to connect the signal lines to the control circuit. Both the array of signal lines and the control circuit may extend the entire width of the display substrate.

Although described in connection with OLED displays, the disclosed devices and methods are not limited to a particular type of display. The edge patterning and metallization may be used in connection with a wide variety of displays and devices. For instance, the edge patterning and metallization may be used in connection with liquid crystal and other displays having a backlight unit. The edge patterning and metallization are also not limited to mobile devices or other devices having small displays. The edge patterning and metallization are instead well suited for use in large format, flat panel displays, such as monitors and televisions.

Figure 2:
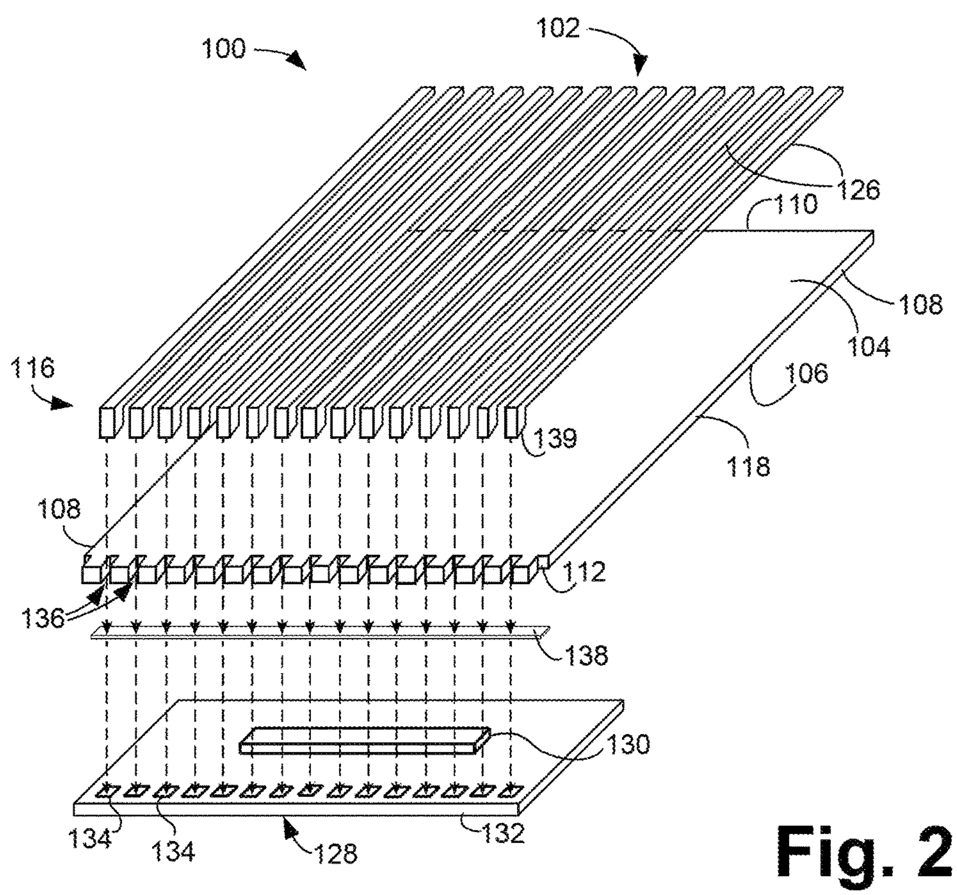
FIG. 2 is a partial, exploded view of the device of FIG. 1.
Figure 3:
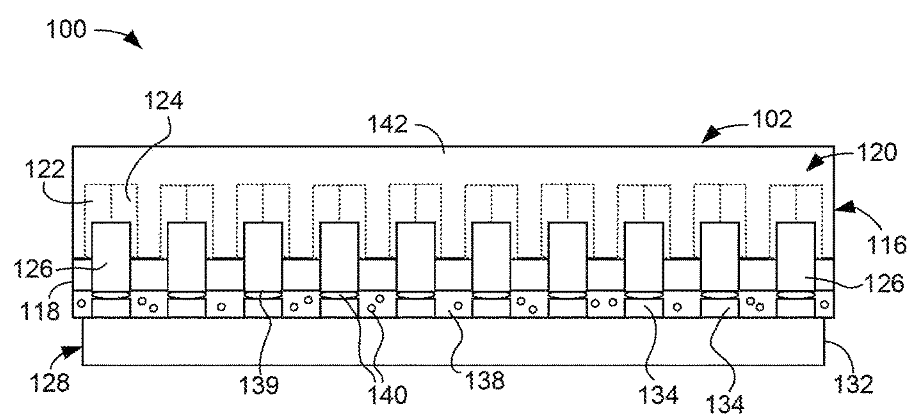
FIG. 3 is an elevational view of a lower edge of the device of FIG. 1.

FIGS. 1-3 depict an electronic device 100 having a display 102 with substrate edge patterning and metallization in accordance with one example. The electronic device 100 may be a mobile phone, tablet, or other handheld or portable device. The electronic device 100 may be any device for which a narrow display border is useful.

The electronic device 100 is shown in simplified form for ease in illustration of the display-related components thereof. For instance, a number of components of the electronic device 100 are not shown, including a case, housing, or other enclosure. The enclosure may form one or more exterior sides of the electronic device 100. A number of internal components are also not shown, including, in some cases, a battery.

The display 102 may be or include a display system, subsystem, or module of the device 100. The display 102 has a front side 104 from which light is emitted, and a back side 106 opposite the front side 104. The front and back sides 104, 106 are defined by side edges 108, an upper edge 110, and a lower edge 112 of the display 102. Inside the edges 108, 110, 112, the display 102 has an active area 114 (FIG. 1) from which display light is emitted. One or more of the display sides and edges may also form or be disposed along the corresponding side or edge of the electronic device 100. In some cases, the device 100 may have a device housing with edges that extend along the edges of the display 102. The active area of the display 102 may thus essentially form the entire front face of the device 100 in such cases.

The display 102 includes, or is configured as, a display panel 116. The lateral extent of the display panel 116 may substantially match the lateral extent of the active area 114 for the reasons described herein. Distributed across the active area 114 and the display panel 116 are an array of pixels of the display 102. Each pixel is separately addressable and driven to control the output of the display 102.

The display panel 116 includes a substrate 118 that supports the components of the pixel array of the display 102. The substrate 118 essentially establishes the dimensions of the display panel 116 and, more generally, the display 102. Accordingly, the sides and edges of the display

102 referenced above are also used herein to address the corresponding edges and sides of the substrate 118. The substrate 118 may thus be considered to have a front side 104, a back side 106, side edges 108, an upper edge 110, and a lower edge 112.

The substrate 118 may be a flexible or rigid substrate. In some cases, the substrate 118 is composed of, or includes, a flexible polymer material, such as polyimide. Alternative or additional materials may be used, including, for instance, glass.

The substrate 118 supports an array 120 (FIG. 3) of thin film transistor (TFT) structures 122 (FIG. 3). The structures 122 are not shown in FIGS. 1 and 2 to better illustrate other components of the display panel 116. In some cases, the array 120 of the TFT structures 122 forms a TFT backplane of the display 102. Operation of the TFT structures 122 controls the activation and deactivation of the pixels of the array 120. Each pixel may include one or more emissive structures 124 (FIG. 3), such as organic light emitting diode (OLED) structures for each sub-pixel color of the pixel. Alternative or additional elements may be included. For example, in non-OLED examples, each pixel of the display panel 116 may include liquid crystal cells and/or other elements controlled by the TFT structures 122.

The display panel 116 includes a plurality of signal lines 126 supported by the display substrate 118 on the front side 104 thereof. The signal lines 126 carry signals used to control and/or operate the pixels of the array, such as the array of TFT structures 122. For example, the signal lines 126 may be or include data signal lines that carry drive (e.g., transistor drain) signals for each pixel (or sub-pixel). Each drive signal may establish a brightness for a pixel (or sub-pixel). Alternatively or additionally, the signal lines may be or include address (e.g., transistor gate) signal lines for each pixel (or sub-pixel). Each address signal may select one or more pixels (or the transistors thereof) for activation.

The signal lines 126 extend across the front side 104 of the substrate 118 to define the active area 114 of the display panel. The signal lines 126 are schematically depicted for ease in illustration. Also for ease in illustration, only the signal lines 126 extending from the lower edge 112 to the upper edge 110 are depicted. The display panel 116 may include another set of signal lines, such as address signal lines, extending across the substrate 118 in an orthogonal direction, e.g., between the side edges 108. The number and spacing (or pitch) of the signal lines 126 along one of the edges 108, 112 establishes the resolution of the display 102. A limited number of signal lines 126 are depicted for ease in illustration.

Each signal line 126 may be or include a conductive trace that extends across the active area 114 of the display 102. In some cases, the signal line 126 includes one or more patterned metal layers. A variety of metals may be used. Other conductive materials may be used. The conductive traces or other signal lines 126 may or may not be uniform across the length thereof. For instance, the composition, width, depth, layers, and/or other characteristics may vary between sections or other components of the signal layers 126. For example, one section of the conductive trace may include a greater or lesser number of metal layers than another section. The thickness of the conductive traces (or other signal lines) may thus vary across the length thereof.

The display 102 includes a display control circuit 128. The control circuit 128 is configured to control the display panel 116. The control circuit 128 is disposed along the back side 106 of the substrate 118. The control circuit 128 may include drive control circuitry for generating drive voltages for the data signal lines, as well as address control circuitry for the address signal lines. The control circuit 128 may include one or more integrated circuit (IC) chips 130 (FIG. 2) directed to these and other functions.

The control circuit 128 includes a circuit substrate 132 on which the IC chip(s) 130 are mounted or otherwise supported. Also supported by the circuit substrate 132 are a plurality of contacts 134 (FIGS. 2 and 3) of the control circuit 128. The contacts 134 are electrically coupled to the IC chip(s) 130. For example, the control circuit 128 may include an array of signal traces or lines running from the contacts 134 to the IC chip(s) 130.

In some cases, the circuit substrate 132 is or includes a flexible film. For example, the circuit substrate 132 may be composed of, or include, a flexible polymer, such as polyimide. In such cases, the IC chip(s) 130 are mounted on the flexible film in a chip-on-film (COF) arrangement. A flexible film may be useful in devices having a flexible display substrate. A flexible display may thus be provided. Other arrangements may be used, including, for instance, chip-on-glass (COG) arrangements.

In this example, the control circuit 128 is attached and electrically connected to the display panel 116 (and the display elements supported thereof) at the lower edge 112 of the display substrate 118. The control circuit 128 may attached at another edge in other cases. As described below, the control circuit 128 and the display panel 116 may be adhesively secured to one another, but other attachment techniques may be alternatively or additionally used.

To facilitate the electrical connection of the display panel 116 and the control circuit 128, the display substrate 118 has a patterned edge. In the example of FIGS. 1-3, the lower edge 112 is patterned. The edge 112 includes a plurality of notches 136 as the patterning. The notches 136 are distributed across the length of the lower edge 112. Alternative or additional edges of the display substrate 118 may be patterned in a similar fashion to support further electrical connections.

Each signal line 126 is disposed in a respective notch 136. Each signal line 126 traverses, or extends over and across, the lower edge 112. In that way, an electrical connection is established between the signal line 126 and the control circuit 128. The end of the signal line 126 terminates at a respective one of the contacts 134 to establish each electrical connection.

The metal or other conductive layers of the signal lines 126 are deposited on the display substrate 118 as well as in the notches 136. In some cases, the metal or other conductive layer(s) of the signal lines 126 have a thickness sufficient to traverse the lower edge 112. Alternatively or additionally, additional metallization is provided at the lower edge 112 to fill the notches 136 sufficiently to connect with the remainder of the signal line 126. For example, one or more additional metal layers may be deposited at the lower edge 126. In some cases, the thickness of the metal layers may vary as a result of, for instance, a damascene or other additive process, a planarization procedure, or other processing.

The display 102 includes a conductive adhesive layer 138 that electrically connects each display signal line 126 with a respective one of the contacts 134. The conductive adhesive layer 138 is disposed along the patterned edge (e.g., the lower edge 112). For instance, the adhesive layer 138 is disposed at ends 139 of the signal lines 126 to adhesively secure the signal lines 126 to the contacts 134. The conductive adhesive layer 138 may extend the length of the lower edge 112 as best shown in FIGS. 2 and 3.

The conductive adhesive layer 138 may be or include an anisotropic conductive film (ACF) to establish respective electrical connections for each signal line 126 and each contact 134. The anisotropic conductive film may be carried by a sacrificial film or layer. Alternatively, the conductive adhesive layer 138 is or includes an anisotropic conductive paste (ACP) applied to a carrier substrate (see, e.g., FIG. 4) on which the display substrate 118 is disposed. The anisotropic conductive film or paste is composed of an anisotropic conductive adhesive (ACA) that includes thermoplastic resin and a number of conductive balls 140 (FIG. 3) suspended in the thermosetting resin. A subset of the conductive balls 140 are disposed between the ends of the signal lines 126 and the contacts 134. An electrical connection is this established. Other conductive balls 140 remain suspended in, and electrically isolated by, the thermosetting resin.

The signal lines 126 are arranged on the front side 104 at a pitch that corresponds with a pitch of the contacts 134. The pitch of the contacts 134 also matches the pitch of the notches 136. With these matching pitches, the layout of the signal lines 126 is aligned with the layout of the contacts 134. The alignment avoids having to resort to trace fan-out to establish all of the connections for the control circuit 128.

FIG. 3 depicts an elevational, side view of the display panel 116 as viewed toward the lower edge 112 of the display substrate 118. The elevational, side view depicts the manner in which the signal lines 126 traverse the lower edge 112 and terminate at the ends 139 at the contacts 134. FIG. 3 also shows the conductive adhesive layer 138 disposed between the ends 139 of the signal lines 126 and the contacts 134. Still further shown is the manner in which the balls 140 of the conductive adhesive layer 138 not compressed between the ends 139 and the contacts 134 are insulated by the thermosetting resin of the conductive adhesive layer 138.

The elevational, side view of FIG. 3 shows the teeth-shaped portions of the display substrate 118 between the notches 136. The teeth-shaped portions are disposed between adjacent signal lines 126. In some cases, the teeth-shaped portions and the signal lines 126 are extend roughly the same amount outward (outward from the plane of FIG. 3) from the remainder of the substrate 118. In other cases, the teeth-shaped portions extend further outward than the signal lines 126, or vice versa.

FIG. 3 also depicts a dielectric layer 142 disposed over the TFT structures 122 and the OLED structures 124. The dielectric layer 142 passivates the TFT structures 122, the OLED structures 124, and other elements of the array 120. Any number of dielectric or other passivation layers may be used.

The display 102 may include additional or alternative layers. For instance, a cover glass or other cover layer may be disposed over the passivation layer 142. The cover layer may have a touch sensor unit disposed thereon. Various touch sensor arrangements may be used. For instance, the touch sensor unit may include a touch sensor panel pre-applied to the outer surface of a color filter layer of the display panel in an in-cell touch sensing arrangement. Other sensor arrangements may be used, such as an on-cell touch sensing arrangement, may also be used. The extent to which the units of the display module 102 are integrated may also vary. For example, a glass layer or polarizer layer of the display panel may form a transparent cover or outer layer.

Figure 4:
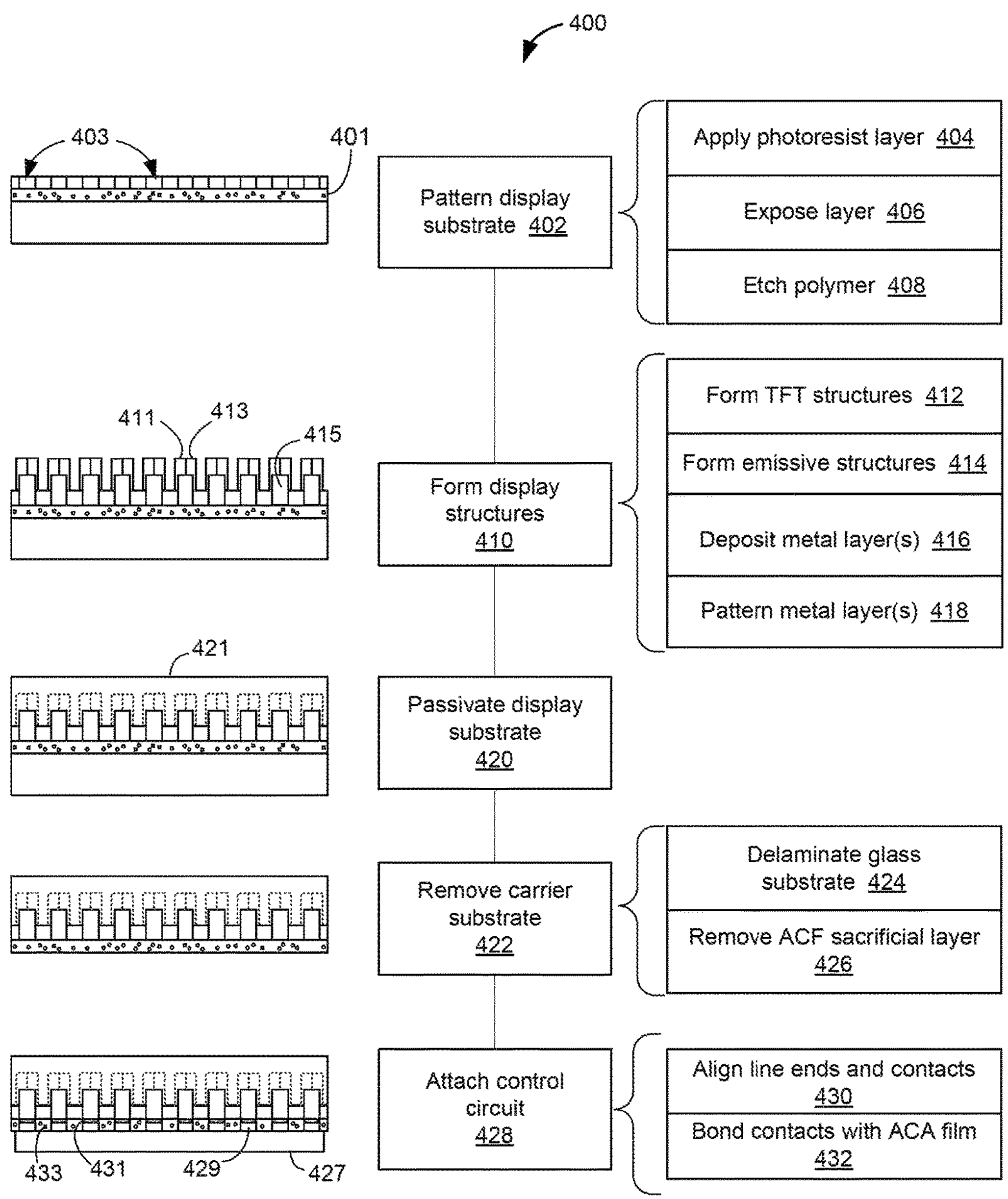
FIG. 4 is a flow diagram of a display fabrication method in which a display substrate edge is patterned and metallized in accordance with one example.

FIG. 4 depicts an exemplary method 400 of fabricating a device having a display with substrate edge patterning and metallization. The acts of the method 400 are shown in connection with schematic depictions of the substrate edge (e.g., a lower edge) to be patterned and metallized for control circuit connection (hereinafter referred to as "the connection edge").

The method 400 may include additional, fewer, or alternative acts. For example, the method 200 may include a number of acts directed to assembling the device, including, for instance, incorporating the display into a case or housing.

The method 400 may begin with one or more acts related to preparing a display substrate for processing. For example, the display substrate may be mounted or otherwise disposed on a carrier substrate. In some cases, a sacrificial layer 401 is deposited or disposed on the carrier substrate before the display substrate. The sacrificial layer may carry a conductive adhesive layer, film, paste, or other structure. In some cases, the conductive adhesive structure is disposed in a strip at or near the connection edge.

The display substrate may be or include a polymer, such as polyimide. The display substrate material may be selected with an eye toward the extent to which the material is capable of being patterned via etching and/or other patterning procedures.

In an act 402, the connection edge of the display substrate is patterned to include a plurality of notches 403. The patterning may be achieved via implementation of one or more photolithography procedures. For example, a photoresist layer is applied to the display substrate in an act 404, after which the photoresist layer is selectively exposed in an act 406. A mask is used to define the notched edge pattern. Etching of the display substrate in an act 408 may then remove the portions of the display substrate in the areas of the notches.

Alternative or additional patterning procedures may be implemented. For example, the connection edge of the display substrate may be patterned via laser ablation. In some cases, a saw-based die cut or other mechanical removal procedure may be used to form the notches.

In an act 410, a number of display structures are formed on the display substrate. The display structures may include a variety of different types of electrical and optical structures. For example, transistors 411, such as thin film transistors (TFT), may be formed in an act 412. Emissive structures 413, such as OLED structures, may be formed in an act 414. A number of metal layers 415 may be deposited in an act 416, and patterned in an act 418, to form conductive traces or signal lines. Additional or alternative structures may be formed. For instance, passive structures, such as liquid crystal structures, may be formed instead of emissive structures. The display structures may be arranged to form pixels in an array that defines the active area of the display.

The display substrate may then be patterned in an act 420. For instance, one or more dielectric layers 421 may be deposited over the display substrate. In this way, the display structures are then covered with one or more passivation layers.

In an act 422, the carrier substrate is removed. In some cases, the carrier substrate is a glass substrate from which the display substrate may be delaminated in an act 424. Alternative or additional procedures may be used to remove the carrier substrate in other cases. For instance, vacuum-based procedures may be used. The removal of the carrier substrate may also remove a sacrificial layer used to apply the conductive adhesive layer to the display substrate. A display panel may be considered to remain after the removal of the carrier substrate and any other sacrificial or otherwise temporary layers.

A control circuit 427 is then attached to the display panel in an act 428. A circuit substrate on which the control circuit is disposed may be positioned near the connection edge of the display substrate. For instance, such positioning may include or result in aligning the ends of the signal lines in the notches with contacts 429 on the circuit substrate in an act 430. Pressure and/or temperature may then be applied to the assembly to bond the line ends and the contacts via conductive beads 431 or other portions of a conductive adhesive film in an act 432. Uncompressed beads 433 in the film are insulated from the contacts 429 by the thermosetting resin of the film.

The attachment of the control circuit and the display panel may include additional acts or procedures. For instance, the adhesive bonding may be reinforced by the application of one or more connectors.

The order of the acts of the method 400 may vary from the example shown. For instance, the formation of one or more of the display structures formed in the act 410 may precede the patterning of the connection edge of the display substrate.

Figure 5:
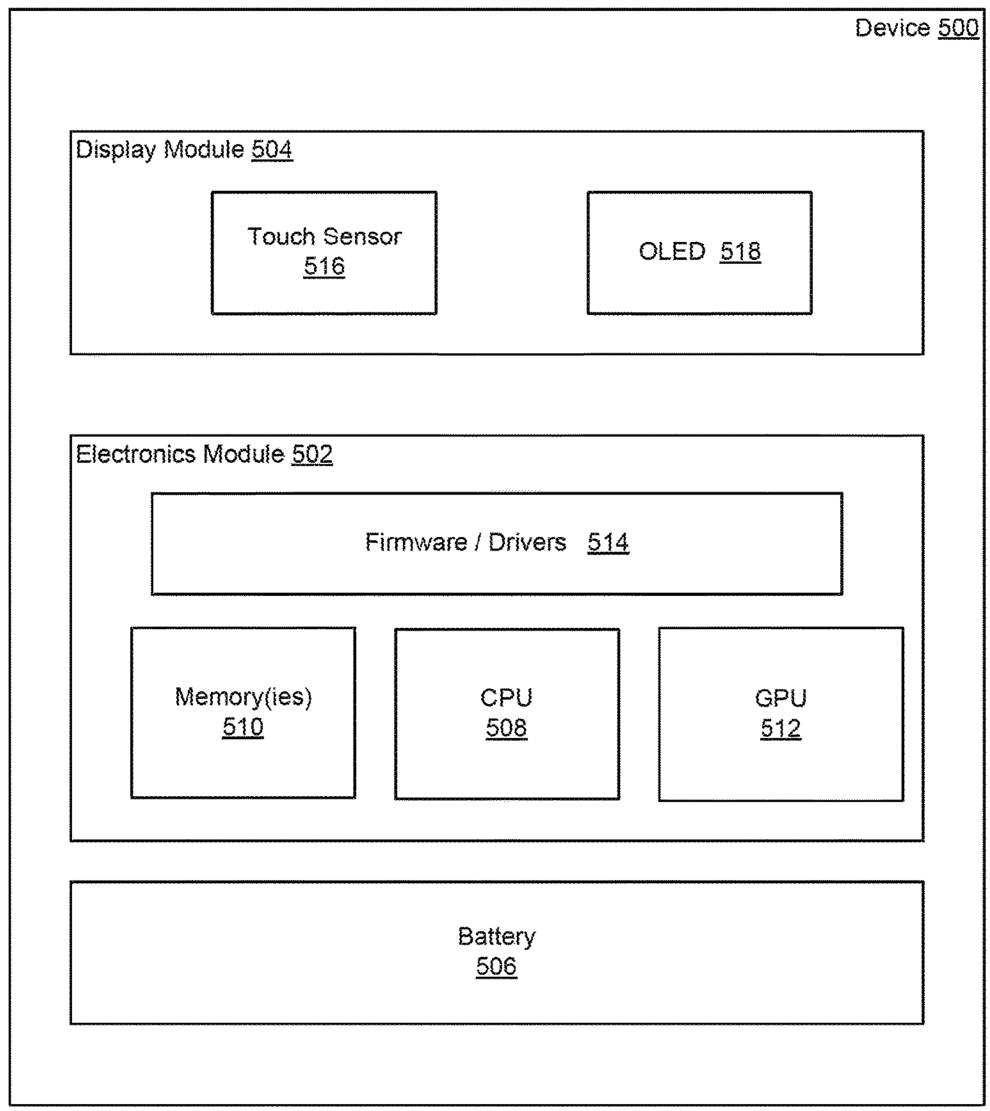
FIG. 5 is a block diagram of an exemplary electronic device into which display substrate edge patterning and metallization is incorporated in accordance with one example.

FIG. 5 shows an exemplary electronic device 500 into which the above-described display substrate edge patterning and metallization may be incorporated. The device 500 includes an electronics module 502 and a display module 504 (or subsystem), and a battery 506. The electronic device 500 may include additional, fewer, or alternative components. For example, the display module 504 may be integrated with the electronics module 502 and/or other components of the electronic device 500 to a varying extent. For instance, the electronics module 502 and/or the display module 504 may include a graphics subsystem of the electronic device 500. Any number of display modules or systems may be included. In this example, the device 500 includes a processor 508 and one or more memories 510 separate from the display module 504. The processor 508 and the memories 510 may be directed to executing one or more applications implemented by the device 500. The display module 504 generates a user interface for an operating environment (e.g., an application environment) supported by the processor 508 and the memories 510. The processor 508 may be a general-purpose processor, such as a central processing unit (CPU), or any other processor or processing unit. Any number of such processors or processing units may be included.

In the example of FIG. 5, the electronics module 502 includes a graphics processing unit (GPU) 512 and firmware and/or drivers 514. The GPU 512 may be dedicated to graphics- or display-related functionality and/or provide general processing functionality. Some of the components of the electronics module 502 may be integrated. For example, the processor 508, the one or more of the memories 510, the GPU 512, and/or the firmware 514 may be integrated as a system-on-a-chip (SoC) or application-specific integrated circuit (ASIC). The electronics module 502 may include additional, fewer, or alternative components. For example, the electronics module 502 may not include a dedicated graphics processor, and instead rely on the CPU 508 or other general-purpose processor to support the graphics-related functionality of the electronic device 500. The electronics module 502 may include additional memory (or memories) to support display-related processing.

In the example of FIG. 5, the display module 504 includes a touch sensor unit 516 and an OLED unit 518. The OLED unit 518 and other components of the display module 504 may be configured in accordance with any one or more of the examples described above. Additional, fewer, or alternative display components may be provided. For example, in some cases, the display module 504 does not include the touch sensor unit 516.

The device 500 may be configured as one of a wide variety of computing devices, including, but not limited to, handheld or wearable computing devices (e.g., tablets and watches), communication devices (e.g., phones), laptop or other mobile computers, personal computers (PCs), and other devices. The device 500 may also be configured as an electronic display device, such as a computer monitor, a television, or other display or visual output device.

Described above are displays, devices, and methods in which display substrate edge patterning and metallization are used to achieve a narrow border. Previous flat panel displays rely on a large bottom border to establish connections to a flexible printed or other circuit. To avoid the large bottom border in plastic OLED and other cases, a polyimide or other substrate is patterned via a photolithography process. On carrier glass, an ACF or ACF-like material is deposited or otherwise disposed for back side bonding of a control circuit (e.g., a circuit on film, or COF, or a flexible printed circuit, or FPC). A narrow bottom border can thus be realized. As a result, a full screen display can be achieved in OLED and other cases. There are also no trace line limitations arising from fan-out area.

In one aspect, a display includes a display substrate having a patterned edge, the patterned edge comprising a plurality of notches, a plurality of display signal lines supported by the display substrate on a first side of the display substrate, and a display control circuit disposed along a second side of the display substrate, the second side being opposite the first side. The display control circuit includes a plurality of contacts. Each display signal line of the plurality of display signal lines is disposed in a respective notch of the plurality of notches to traverse the patterned edge to establish an electrical connection between each display signal line of the plurality of display signal lines and a respective contact of the plurality of contacts.

In another aspect, a device includes a display panel including a substrate and a plurality of signal lines supported by the display substrate, the plurality of signal lines extending across a first side of the substrate to define an active area of the display panel, and a display control circuit configured to control the display panel and disposed along a second side of the substrate, the second side being opposite the first side. The substrate has a patterned edge. The patterned edge includes a plurality of notches. Each signal line of the plurality of signal lines is disposed in a respective notch of the plurality of notches to traverse the edge to establish an electrical connection between the plurality of display signal lines and the display control circuit.

In yet another aspect, a method of fabricating a display includes patterning a display substrate supported by a carrier substrate such that the display substrate has a patterned edge with a plurality of notches, forming display structures on a first side of the display substrate, the display structures comprising a plurality of signal lines to define an active area of the display, each signal line of the plurality of signal lines being disposed in a respective notch of the plurality of notches, removing the carrier substrate from a second side of the display substrate opposite the first side, and attaching a control circuit along the second side of the display substrate, the control circuit comprising a plurality of contacts, wherein attaching the control circuit includes establishing, at the patterned edge, an electrical connection between each respective contact of the plurality of contacts and a respective signal line of the plurality of signal lines.

In connection with any one of the aforementioned aspects, the systems, devices, and/or methods described herein may alternatively or additionally include any combination of one or more of the following aspects or features. The display further includes a conductive adhesive layer that electrically connects each display signal line of the plurality of display signal lines with a respective contact of the plurality of contacts. The conductive adhesive layer is disposed along the patterned edge at ends of the plurality of display signal lines to adhesively secure the plurality of display signal lines to the plurality of contacts. The conductive adhesive layer comprises an anisotropic conductive film (ACF). The display control circuit includes a circuit substrate disposed along the second side of the display substrate, the plurality of contacts being supported by the circuit substrate. The circuit substrate includes a flexible film. The display control circuit includes an integrated circuit (IC) chip, and the IC chip is mounted on the flexible film in a chip-on-film arrangement. The substrate includes a flexible polymer. Each display signal line of the plurality of display signal lines includes a respective conductive trace supported by the display substrate along the first side of the display substrate and along the patterned edge. Each respective conductive trace extends across an active area of the display. The plurality of display signal lines are arranged on the first side of the display substrate at a pitch that corresponds with a pitch of the plurality of notches. The plurality of display signal lines are arranged on the first side of the display substrate at a pitch that corresponds with a pitch of the plurality of contacts. The display control circuit includes a plurality of contacts. The device further includes a conductive adhesive layer that electrically connects each display signal line of the plurality of display signal lines with a respective contact of the plurality of contacts. The conductive adhesive layer is disposed along the patterned edge at ends of the plurality of display signal lines to adhesively secure the plurality of display signal lines to the plurality of contacts. The plurality of signal lines are arranged on the first side of the display substrate at a pitch that corresponds with a pitch of the plurality of contacts. The display control circuit includes a circuit substrate disposed along the second side of the display substrate. The circuit substrate includes a flexible film. The display control circuit includes an integrated circuit (IC) chip, and the IC chip is mounted on the flexible film in a chip-on-film arrangement. Attaching the control circuit includes bonding ends of the plurality of signal lines at the patterned edge to the plurality of contacts with a conductive adhesive layer that establishes the electrical connection. Forming the display structures includes depositing a metal layer across the first side of the display substrate and in the plurality of notches, and patterning the deposited metal layer to define the plurality of signal lines. The plurality of signal lines are arranged on the first side of the display substrate at a pitch that corresponds with a pitch of the plurality of contacts such that attaching the control circuit comprises aligning the plurality of contacts and the plurality signal lines.

The present disclosure has been described with reference to specific examples that are intended to be illustrative only and not to be limiting of the disclosure. Changes, additions and/or deletions may be made to the examples without departing from the spirit and scope of the disclosure.

The foregoing description is given for clearness of understanding only, and no unnecessary limitations should be understood therefrom.

What is claimed is:

1. A display comprising:
- a display substrate having a patterned edge, the patterned edge comprising a plurality of notches;
- a plurality of display signal lines supported by the display substrate on a first side of the display substrate; and
- a display control circuit disposed along a second side of the display substrate, the second side being opposite the first side;
- wherein:
  - the display control circuit comprises a plurality of contacts; and
  - each display signal line of the plurality of display signal lines is disposed in a respective notch of the plurality of notches to traverse the patterned edge to establish an electrical connection between each display signal line of the plurality of display signal lines and a respective contact of the plurality of contacts.

2. The display of claim 1, further comprising a conductive adhesive layer that electrically connects each display signal line of the plurality of display signal lines with a respective contact of the plurality of contacts.

3. The display of claim 2, wherein the conductive adhesive layer is disposed along the patterned edge at ends of the plurality of display signal lines to adhesively secure the plurality of display signal lines to the plurality of contacts.

4. The display of claim 2, wherein the conductive adhesive layer comprises an anisotropic conductive film (ACF).

5. The display of claim 1, wherein the display control circuit comprises a circuit substrate disposed along the second side of the display substrate, the plurality of contacts being supported by the circuit substrate.

6. The display of claim 5, wherein:
- the circuit substrate comprises a flexible film;
- the display control circuit comprises an integrated circuit (IC) chip; and
- the IC chip is mounted on the flexible film in a chip-on-film arrangement.

7. The display of claim 6, wherein the substrate comprises a flexible polymer.

8. The display of claim 1, wherein each display signal line of the plurality of display signal lines comprises a respective conductive trace supported by the display substrate along the first side of the display substrate and along the patterned edge.

9. The display of claim 8, wherein each respective conductive trace extends across an active area of the display.

10. The display of claim 1, wherein the plurality of display signal lines are arranged on the first side of the display substrate at a pitch that corresponds with a pitch of the plurality of notches.

11. The display of claim 1, wherein the plurality of display signal lines are arranged on the first side of the display substrate at a pitch that corresponds with a pitch of the plurality of contacts.

12. A device comprising:
- a display panel comprising a substrate and a plurality of signal lines supported by the display substrate, the plurality of signal lines extending across a first side of the substrate to define an active area of the display panel; and
- a display control circuit configured to control the display panel and disposed along a second side of the substrate, the second side being opposite the first side;
- wherein:
  - the substrate has a patterned edge;
  - the patterned edge comprises a plurality of notches; and each signal line of the plurality of signal lines is disposed in a respective notch of the plurality of notches to traverse the edge to establish an electrical connection between the plurality of display signal lines and the display control circuit.

13. The device of claim 12, wherein:

the display control circuit comprises a plurality of contacts; and the device further comprises a conductive adhesive layer that electrically connects each display signal line of the plurality of display signal lines with a respective contact of the plurality of contacts.

14. The device of claim 13, wherein the conductive adhesive layer is disposed along the patterned edge at ends of the plurality of display signal lines to adhesively secure the plurality of display signal lines to the plurality of contacts.

15. The device of claim 13, wherein the plurality of signal lines are arranged on the first side of the display substrate at a pitch that corresponds with a pitch of the plurality of contacts.

16. The device of claim 12, wherein:

the display control circuit comprises a circuit substrate disposed along the second side of the display substrate;

the circuit substrate comprises a flexible film;

the display control circuit comprises an integrated circuit (IC) chip; and the IC chip is mounted on the flexible film in a chip-on-film arrangement.

17. A method of fabricating a display, the method comprising:

patterning a display substrate supported by a carrier substrate such that the display substrate has a patterned edge with a plurality of notches;

forming display structures on a first side of the display substrate, the display structures comprising a plurality of signal lines to define an active area of the display, each signal line of the plurality of signal lines being disposed in a respective notch of the plurality of notches;

removing the carrier substrate from a second side of the display substrate opposite the first side; and attaching a control circuit along the second side of the display substrate, the control circuit comprising a plurality of contacts, wherein attaching the control circuit comprises establishing, at the patterned edge, an electrical connection between each respective contact of the plurality of contacts and a respective signal line of the plurality of signal lines.

18. The method of claim 17, wherein attaching the control circuit comprises bonding ends of the plurality of signal lines at the patterned edge to the plurality of contacts with a conductive adhesive layer that establishes the electrical connection.

19. The method of claim 17, wherein forming the display structures comprises:

depositing a metal layer across the first side of the display substrate and in the plurality of notches; and patterning the deposited metal layer to define the plurality of signal lines.

20. The method of claim 17, wherein the plurality of signal lines are arranged on the first side of the display substrate at a pitch that corresponds with a pitch of the plurality of contacts such that attaching the control circuit comprises aligning the plurality of contacts and the plurality signal lines.

* * * * *